United States Patent
Kim et al.

(10) Patent No.: US 9,495,047 B2
(45) Date of Patent: Nov. 15, 2016

(54) LIQUID CRYSTAL DISPLAY DEVICE COMPRISING FIRST AND SECOND TOUCH ELECTRODES AND METHOD OF MANUFACTURING THE SAME

(71) Applicant: SAMSUNG DISPLAY CO., LTD., Yongin, Gyeonggi-Do (KR)

(72) Inventors: Hyun-Young Kim, Yongin (KR); Yun-Kyeong In, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 131 days.

(21) Appl. No.: 14/161,161

(22) Filed: Jan. 22, 2014

(65) Prior Publication Data

US 2014/0327840 A1 Nov. 6, 2014

(30) Foreign Application Priority Data

May 6, 2013 (KR) .................. 10-2013-0050804

(51) Int. Cl.
*G02F 1/1335* (2006.01)
*G06F 3/044* (2006.01)
(Continued)

(52) U.S. Cl.
CPC ........... *G06F 3/044* (2013.01); *G02F 1/13338* (2013.01); *G02F 1/136286* (2013.01); *G06F 2203/04103* (2013.01); *H01L 27/3276* (2013.01)

(58) Field of Classification Search
CPC .................. G06F 3/0412; G06F 2203/04104; G06F 3/0416; G06F 3/044; G02F
(Continued)

(56) References Cited

U.S. PATENT DOCUMENTS 6,433,841 B1* 8/2002 Murade ............... G02F 1/13454
349/110
7,580,084 B2* 8/2009 Yu ........................ G02F 1/13338
345/104
(Continued)

FOREIGN PATENT DOCUMENTS

KR  1020110058895  6/2011
KR  1020120027412  3/2012
(Continued)

OTHER PUBLICATIONS

US 20120086654 corresponds to KR1020120036521.
(Continued)

*Primary Examiner* — Paisley L Arendt
(74) *Attorney, Agent, or Firm* — F. Chau & Associates, LLC

(57) ABSTRACT

A liquid crystal display device includes a first substrate, a second substrate facing the first substrate, a liquid crystal layer disposed between the first and second substrates, a pixel electrode, a common electrode facing the pixel electrode, a plurality of first touch electrodes, and a plurality of second touch electrodes. Each first touch electrode includes a main body portion extending in a first direction and a plurality of branching portions extending from the main body portion in a second direction. The plurality of second touch electrodes cross the main body portion of each first touch electrode.

23 Claims, 10 Drawing Sheets

(51) Int. Cl.
*G02F 1/1333* (2006.01)
*G02F 1/1362* (2006.01)
*H01L 27/32* (2006.01)

(58) Field of Classification Search
CPC ..................... 1/13338;G02F 1/136286; H01L 27/3276
USPC ........................................ 349/139, 141, 143
See application file for complete search history.

(56) References Cited

U.S. PATENT DOCUMENTS

| | | |
|---|---|---|
| 7,663,607 B2 | 2/2010 | Hotelling et al. |
| 8,953,130 B2* | 2/2015 | Nakamura ................... 349/139 |
| 8,964,134 B2* | 2/2015 | Naoe ................... G02F 1/13439 178/18.06 |
| 2011/0102698 A1* | 5/2011 | Wang ................... G02F 1/13338 349/54 |
| 2011/0163992 A1 | 7/2011 | Cordeiro et al. |
| 2011/0227851 A1* | 9/2011 | Oh ................... G02F 1/13338 345/173 |
| 2012/0086654 A1 | 4/2012 | Song |
| 2012/0113027 A1 | 5/2012 | Song et al. |
| 2012/0268423 A1 | 10/2012 | Hotelling et al. |
| 2013/0016297 A1* | 1/2013 | Nakamura ........ G02F 1/133707 349/46 |
| 2014/0062933 A1* | 3/2014 | Coulson ................... G06F 3/044 345/174 |
| 2014/0085222 A1* | 3/2014 | Park et al. .................... 345/173 |
| 2014/0125626 A1* | 5/2014 | Yang ................ G02F 1/134336 345/174 |

FOREIGN PATENT DOCUMENTS

| | | |
|---|---|---|
| KR | 1020120036521 | 4/2012 |
| KR | 1020120049428 | 5/2012 |

OTHER PUBLICATIONS

US 20120268423 corresponds to KR 1020110058895.
US 20120113027 corresponds to KR 1020120049428.
US 20110163992 corresponds to KR 1020120027412.

* cited by examiner

LIQUID CRYSTAL DISPLAY DEVICE COMPRISING FIRST AND SECOND TOUCH ELECTRODES AND METHOD OF MANUFACTURING THE SAME

CROSS-REFERENCE TO RELATED PATENT APPLICATIONS

This application claims priority under 35 U.S.C. §119 to Korean Patent Application No. 10-2013-0050804, filed on May 6, 2013, the disclosure of which is incorporated by reference herein in its entirety.

TECHNICAL FIELD

Exemplary embodiments of the present invention relate to a liquid crystal display device and a method of manufacturing the same, and more particularly, to a liquid crystal display device capable of performing a touch function and a method of manufacturing the same.

DISCUSSION OF THE RELATED ART

Liquid crystal display devices are widely used due to their efficient manufacturing process, low power consumption, and high image quality. In addition, the use of touch panels capable of recognizing touches of users' fingers, pens, etc. as input devices is increasing. Liquid crystal display devices that incorporate touch panel functions without negatively affecting image quality characteristics can provide increased user convenience.

SUMMARY

According to an exemplary embodiment of the present invention, a liquid crystal display device includes a first substrate, a second substrate that faces the first substrate, a liquid crystal layer that is disposed between the first substrate and the second substrate, a pixel electrode and a common electrode that face each other to drive the liquid crystal layer, a plurality of first touch electrodes that each include a main body portion extending in one direction, a plurality of branching portions branching from the main body portion, and a plurality of second touch electrodes that are each formed to cross the main body portion.

The plurality of branching portions may be spaced apart from one another.

The plurality of branching portions of one first touch electrode from among the plurality of first touch electrodes may be spaced apart from the main body portion of another first touch electrode adjacent to the one first touch electrode.

The liquid crystal display device may further include a plurality of scan lines and a plurality of data lines that control electrical characteristics of the pixel electrode, wherein the plurality of branching portions are formed to overlap with at least the plurality of data lines.

The common electrode may be formed on the plurality of first touch electrodes.

The common electrode may be formed to contact the plurality of first touch electrodes.

A plurality of the common electrodes may longitudinally extend to correspond to the plurality of first touch electrodes.

A plurality of the common electrodes may be spaced apart from one another.

The liquid crystal display device may further include an active layer, a gate electrode, and source and drain electrodes that are disposed between the first substrate and the pixel electrode, wherein the liquid crystal display device further includes at least one insulating layer that is formed between the pixel electrode and the source and drain electrodes, wherein any one of the pixel electrode and the source and drain electrodes is connected through a via-hole that is formed in the at least one insulating layer.

A plurality of the common electrodes may be formed to correspond to the plurality of first touch electrodes, wherein each of the plurality of common electrodes includes a concave portion that corresponds to the via-hole.

Each of the plurality of common electrodes may be formed not to overlap with the via-hole due to the concave portion.

The concave portion may be formed in one side of each of the plurality of common electrodes or a side opposite to the one side of each of the plurality of common electrodes.

The main body portion of each of the plurality of first touch electrodes may include a concave portion that corresponds to the via-hole.

The concave portion of the main body portion of each of the plurality of touch electrodes may be formed to face the via-hole.

The concave portion of the main body portion of each of the plurality of first touch electrodes may be formed to have a width greater than a width of the via-hole.

Each of the plurality of first touch electrodes may further include a connecting portion that is formed to connect two adjacent branching portions from among the plurality of branching portions of each of the plurality of first touch electrodes.

The liquid crystal display device may further include a plurality of color filters that are disposed between the first substrate and the second substrate, wherein color filters that are disposed at both sides of each of the plurality of branching portions from among the plurality of color filters are formed such that side surfaces of the color filters contact each other.

The plurality of second touch electrodes may be formed on the second substrate.

The plurality of first touch electrodes may be formed of an opaque metal material.

According to an exemplary embodiment of the present invention, a method of manufacturing a liquid crystal display device includes preparing a first substrate and a second substrate that faces the first substrate, forming a liquid crystal layer that is disposed between the first substrate and the second substrate, forming a pixel electrode and a common electrode that face each other to drive the liquid crystal layer, forming a plurality of first touch electrodes that are disposed between the first substrate and the second substrate and each include a main body portion extending in one direction and a plurality of branching portions branching from the main body portion, and forming a plurality of second touch electrodes that are each formed to cross the main body portion.

According to an exemplary embodiment of the present invention, a liquid crystal display device includes a first substrate, a second substrate facing the first substrate, a liquid crystal layer disposed between the first substrate and the second substrate, a pixel electrode, a common electrode facing the pixel electrode, a plurality of first touch electrodes, wherein each first touch electrode includes a main body portion extending in a first direction and a plurality of branching portions extending from the main body portion in a second direction, different from the first direction, and a plurality of second touch electrodes crossing the main body portion of each first touch electrode from among the plurality of first touch electrodes.

According to an exemplary embodiment of the present invention, a method of manufacturing a liquid crystal display device includes forming a first substrate, forming a second substrate that faces the first substrate, forming a liquid crystal layer between the first substrate and the second substrate, forming a pixel electrode, forming a common electrode that faces the pixel electrode, forming a plurality of first touch electrodes disposed between the first substrate and the second substrate, wherein each first touch electrode includes a main body portion extending in a first direction and a plurality of branching portions extending from the main body portion in a second direction, different from the first direction, and forming a plurality of second touch electrodes that cross the main body portion of each first touch electrode from among the plurality of first touch electrodes.

According to an exemplary embodiment of the present invention, a liquid crystal display device includes a first substrate, a second substrate facing the first substrate, a liquid crystal layer disposed between the first substrate and the second substrate, a pixel electrode disposed on the first substrate, a first touch electrode disposed on the first substrate, wherein the first touch electrode includes a main body portion extending in a first direction and a plurality of branching portions extending from the main body portion in a second direction, substantially perpendicular to the first direction, a common electrode disposed on and contacting the first touch electrode, a second touch electrode disposed on the second substrate and crossing the main body portion of the first touch electrode, a plurality of scan lines extending in the first direction, wherein the main body portion of the first touch electrode overlaps a scan line from among the plurality of scan lines, and a plurality of data line extending in the second direction, wherein each branching portion from among the plurality of branching portions overlaps a data line from among the plurality of data lines.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
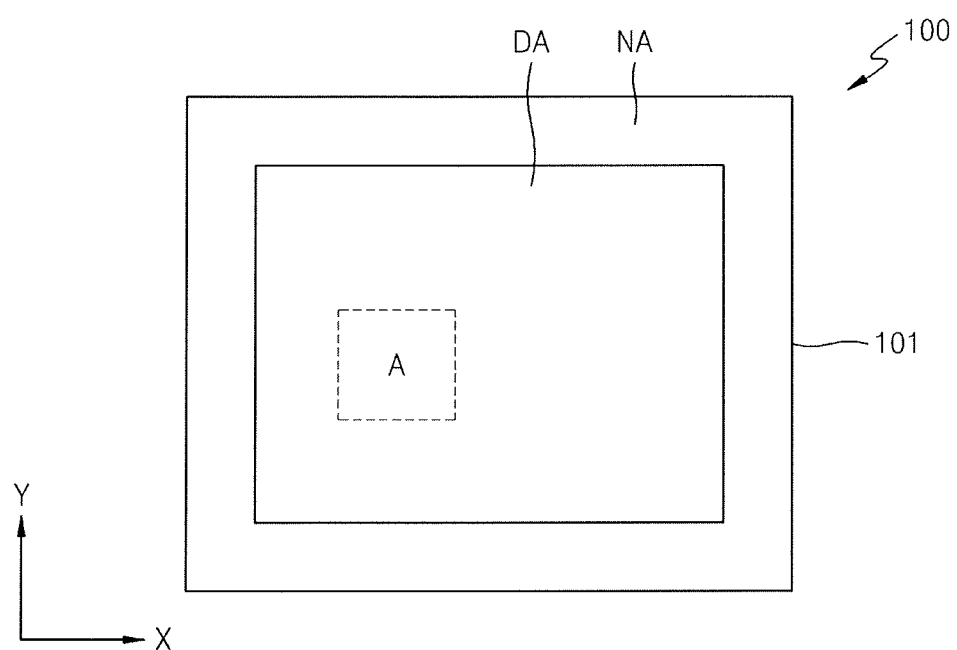
FIG. 1 is a plan view illustrating a liquid crystal display device, according to an exemplary embodiment of the present invention.

Exemplary embodiments of the present invention will be described more fully hereinafter with reference to the accompanying drawings. Like reference numerals may refer to like elements throughout the accompanying drawings.

Sizes and thicknesses of elements in the drawings are arbitrarily shown for convenience of explanation, and thus, exemplary embodiments of the present invention are not limited thereto.

Thicknesses of various layers and regions in the drawings may appear greater than actual thicknesses for clarity. Further, thicknesses of some layers and regions in the drawings may be exaggerated for convenience of explanation. It will also be understood that when a layer, film, region, or substrate is referred to as being "on" another layer, film, region, or substrate, it may be directly on the other layer, film, region, or substrate, or intervening layers, films, regions, or substrates may also be present therebetween.

It will be further understood that when a part "includes" an element, unless otherwise defined, the part may further include other elements, not excluding the other elements. Also, when an element is referred to as being disposed "on" another element, the term "on" may encompass both orientations of "over" and "under."

Figure 2:
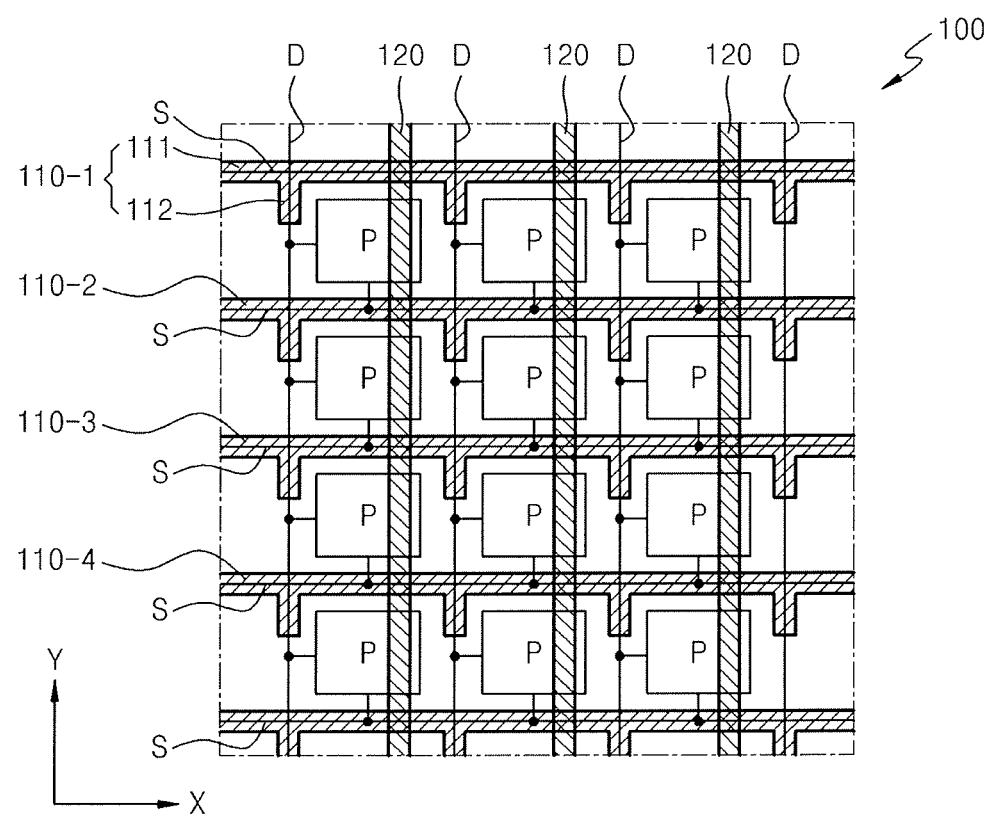
FIG. 2 is an enlarged view illustrating portion A of FIG. 1, according to an exemplary embodiment of the present invention.
Figure 3:
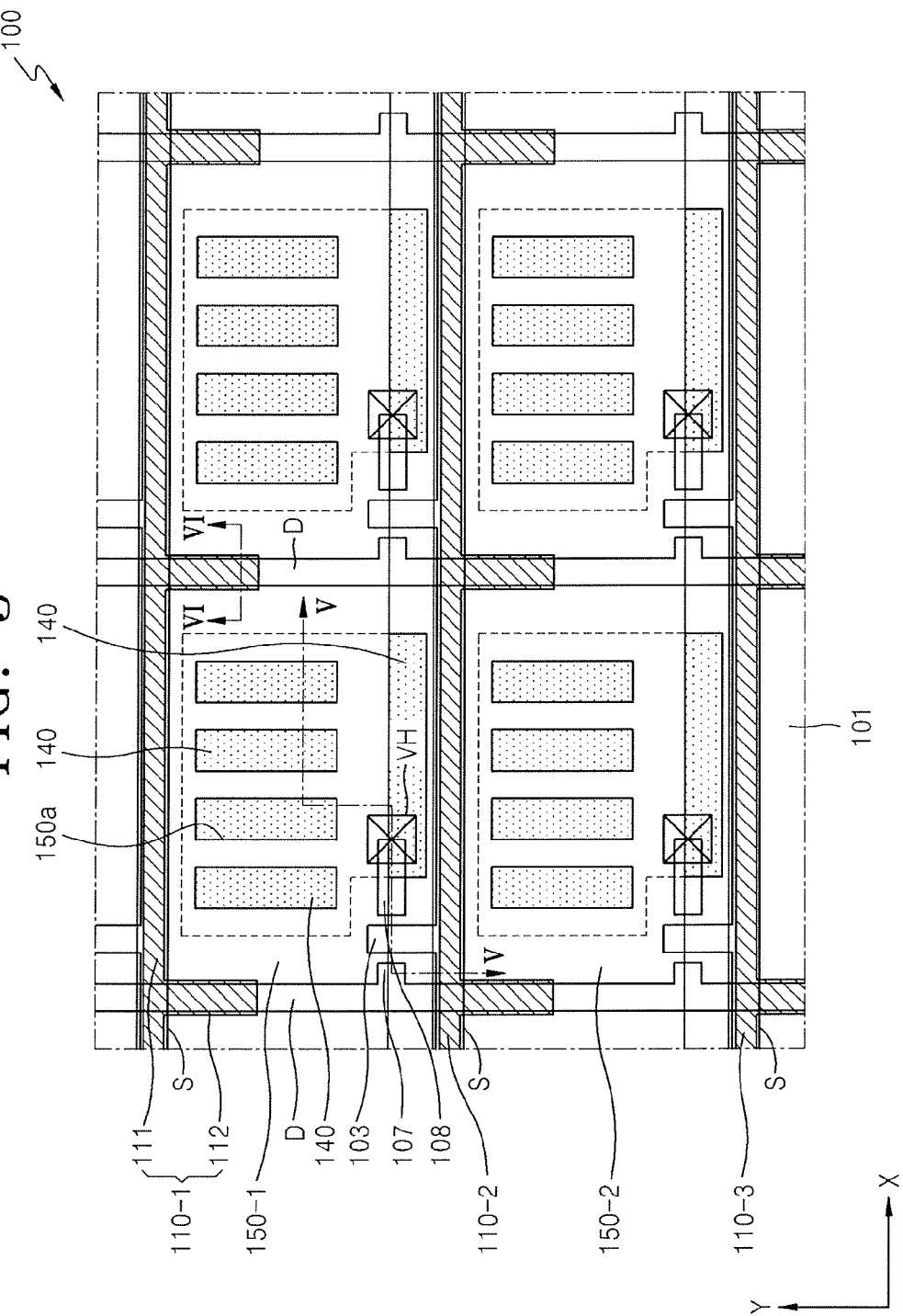
FIG. 3 is a view illustrating further detail of portion A of FIG. 2, according to an exemplary embodiment of the present invention.
Figure 4:
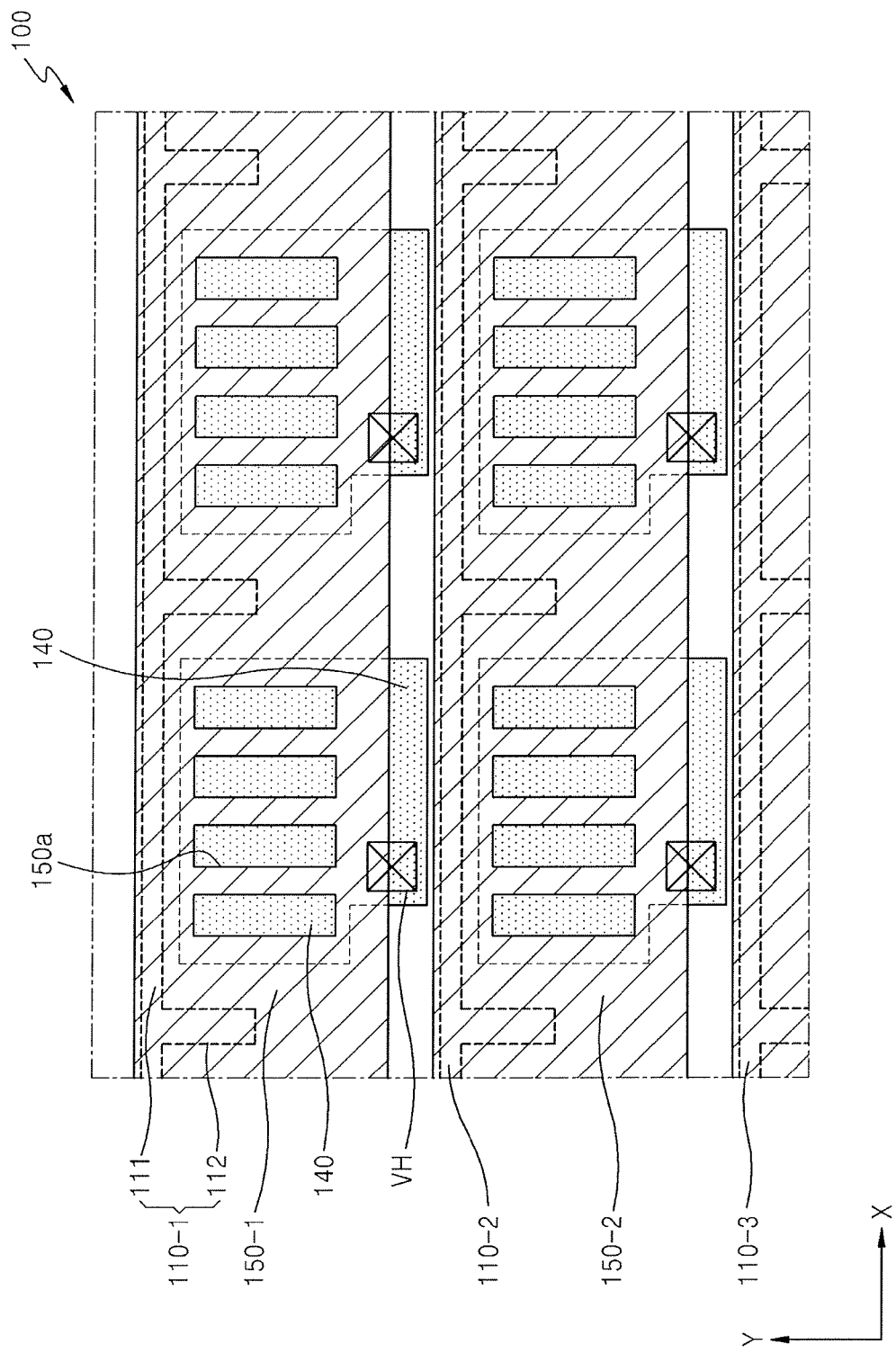
FIG. 4 is a view illustrating common electrodes of FIG. 3, according to an exemplary embodiment of the present invention.
Figure 5:
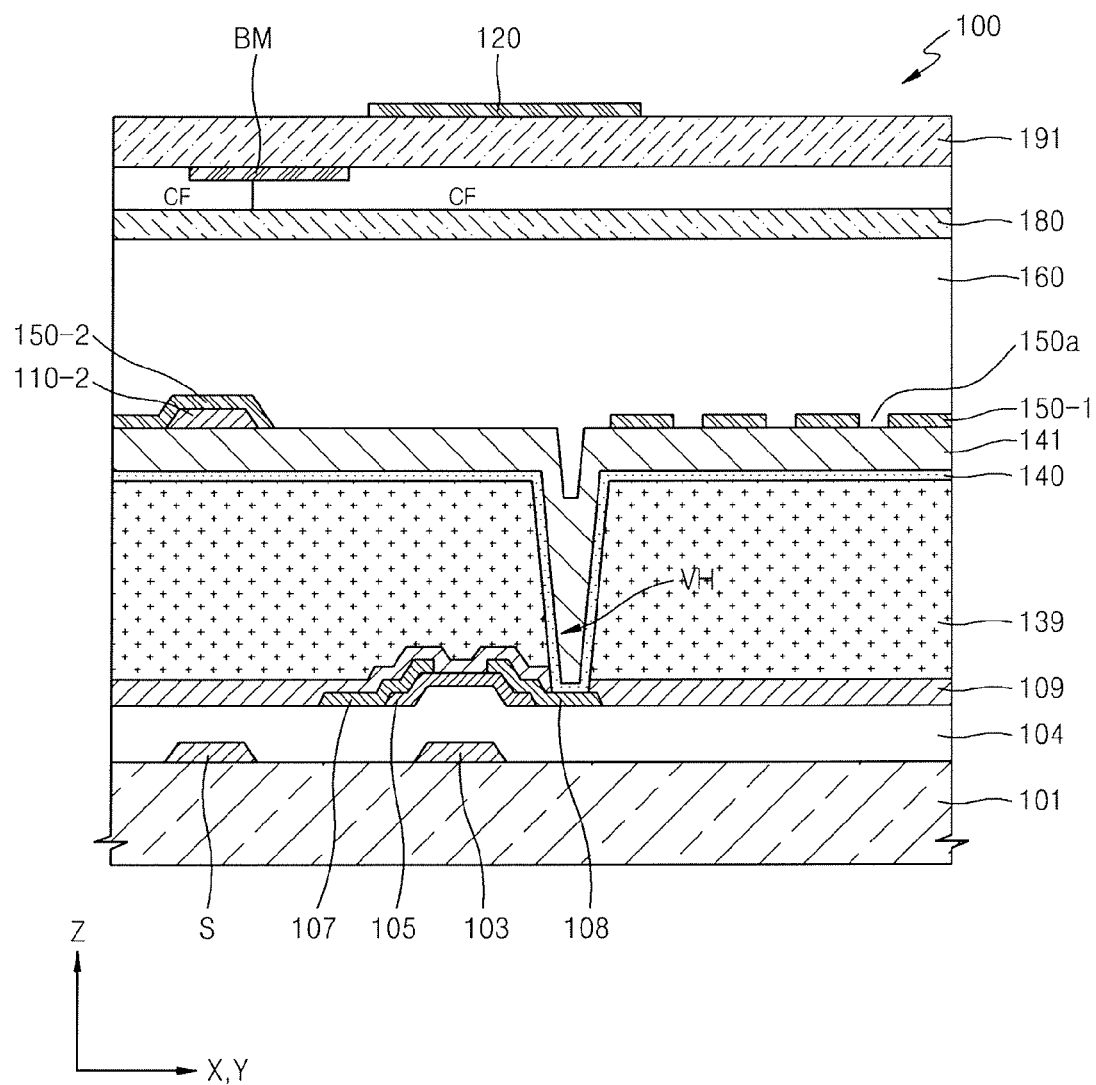
FIG. 5 is a cross-sectional view taken along line V-V of FIG. 3, according to an exemplary embodiment of the present invention.
Figure 6:
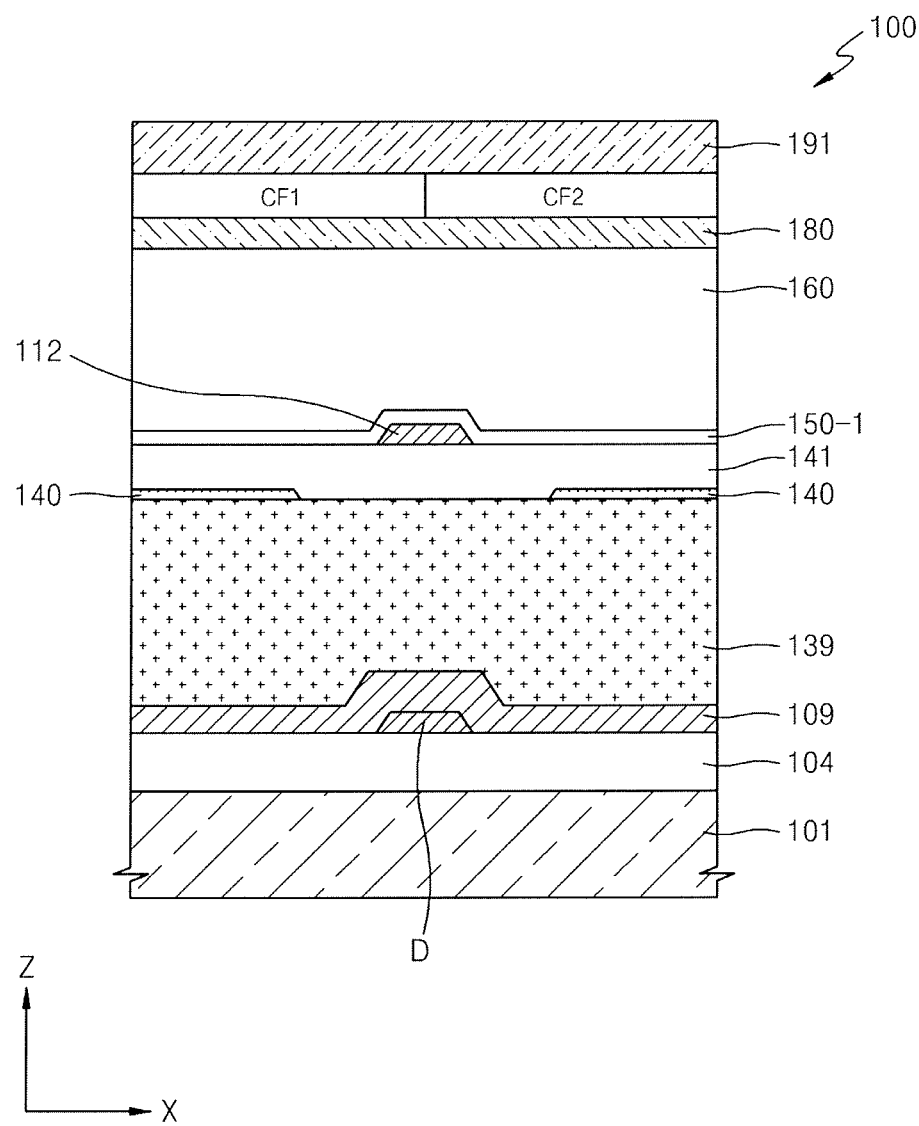
FIG. 6 is a cross-sectional view taken along line VI-VI of FIG. 3, according to an exemplary embodiment of the present invention.

FIG. 1 is a plan view illustrating a liquid crystal display device 100, according to an exemplary embodiment of the present invention. FIG. 2 is an enlarged view illustrating portion A of FIG. 1, according to an exemplary embodiment. FIG. 3 is a view illustrating further detail of portion A of FIG. 2, according to an exemplary embodiment. FIG. 4 is a view illustrating common electrodes 150-1 and 150-2 of FIG. 3, according to an exemplary embodiment. FIG. 5 is a cross-sectional view taken along line V-V of FIG. 3, according to an exemplary embodiment. FIG. 6 is a cross-sectional view taken along line VI-VI of FIG. 3, according to an exemplary embodiment.

Referring to FIGS. 1 through 6, the liquid crystal display device 100 may include a first substrate 101, a second substrate 191, a liquid crystal layer 160, a pixel electrode 140, the common electrodes 150-1 and 150-2, first touch electrodes 110-1 through 110-4, and second touch electrodes 120.

Referring to FIG. 1, the liquid crystal display device 100 includes a display area DA and a non-display area NA on the first substrate 101. Although the non-display area NA is shown as being formed around the display area DA in FIG. 1, exemplary embodiments are not limited thereto. For example, the non-display area NA may be formed to correspond to one side surface, two side surfaces, or three side surfaces of the display area DA. Alternatively, the non-display area NA may not be formed on the first substrate 101.

Referring to FIG. 2, in the liquid crystal display device 100, one or more pixels P that form an image are formed on the display area DA.

As shown in FIG. 5, each of the pixels P includes the liquid crystal layer 160, and the pixel electrode 140 and the common electrodes 150-1 and 150-2 that drive the liquid crystal layer 160, which is described in further detail below.

A plurality of scan lines S and a plurality of data lines D are disposed to be respectively connected to the pixels P. Fur example, the plurality of scan lines S are arranged at predetermined intervals in one direction (e.g., in a Y-axis direction in FIG. 2), and each scan line S longitudinally extends in one direction (e.g., in an X-axis direction in FIG. 2). The plurality of data lines D are arranged at predetermined intervals in one direction (e.g., in the X-axis direction in FIG. 2), and each data line D longitudinally extends in one direction (e.g., in the Y-axis direction in FIG. 2).

The first touch electrodes 110-1 through 110-4 and the second touch electrodes 120 enable the liquid crystal display device 100 to perform a touch recognition function in addition to an image-forming function. For example, the liquid crystal display device 100 recognizes a user's touch by detecting a change in a capacitance formed in regions where the first touch electrodes 110-1 through 110-4 and the second touch electrodes 120 cross each other.

In this case, the first touch electrodes 110-1 through 110-4 may function as driving electrodes, and the second touch electrodes 120 may function as detection electrodes. At least one insulating layer is disposed between the first touch electrodes 110-1 through 110-4 and the second touch electrodes 120.

The first touch electrodes 110-1 through 110-4 are described in further detail herein. For convenience of explanation, since the first touch electrodes 110-1 through 110-4 have the same, or substantially the same structure, only the first touch electrode 110-1 will be described. The first touch electrode 110-1 includes a main body portion 111 extending in a first direction, and a plurality of branching portions 112 extending in a second direction, different from the first direction. In an exemplary embodiment, the plurality of branching portions 112 may extend in a substantially perpendicular direction relative to the main body portion 111. The plurality of branching portions 112 are disposed at predetermined intervals to be spaced apart from one another. In this case, the plurality of branching portions 112 of the first touch electrode 110-1 are formed to be spaced apart from the first touch electrode 110-2 that is adjacent to the first touch electrode 110-1.

The plurality of branching portions 112 are connected to the main body portion 111, and may reduce overall resistance of the first touch electrode 110-1. For example, when a touch recognition function is performed using the first touch electrodes 110-1 through 110-4 and the second touch electrodes 120, an electrical signal may be stably and consistently applied to the first touch electrodes 110-1 through 110-4, which may improve touch function characteristics of the liquid crystal display device 100.

Further, when the first touch electrode 110-1 is formed, the branching portions 112 may be formed to overlap with the data lines D. As a result, an aperture ratio of the liquid crystal display device 100 may not be limited, which may improve touch function characteristics without affecting image quality characteristics of the liquid crystal display device 100.

The first touch electrode 110-1, the first touch electrode 110-2, and each of the pixels P are described in further detail with reference to FIGS. 3 through 6. It is to be understood that exemplary embodiments of the present invention are not limited to the structure shown in FIG. 3. For example, exemplary embodiments may be applied to any of a variety of structures, including, for example, the structure shown in FIG. 2.

The first substrate 101 may be formed of a transparent glass material including, for example, $SiO_2$. However, the first substrate 101 is not limited thereto. For example, the first substrate 101 may be formed of a transparent plastic material. In this case, the plastic material used to form the first substrate 101 may be at least one material selected from among various organic materials.

A buffer layer may be formed on the first substrate 101. The buffer layer may prevent impurity elements from penetrating into the first substrate 101 (or reduce the amount of impurity elements that penetrate into the first substrate 101), and planarize a top surface of the first substrate 101. The buffer layer may be formed of any of various materials capable of performing these functions.

A gate electrode 103 is formed on the first substrate 101. The gate electrode 103 is connected to the scan lines S, as shown in FIG. 3. The structure of the gate electrode 103 shown in FIG. 3 is exemplary, and the structure of the gate electrode 103 is not limited thereto. For example, the gate electrode 103 may have any of various sizes and shapes. The gate electrode 103 may include, for example, gold (Au), silver (Ag), copper (Cu), nickel (Ni), platinum (Pt), palladium (Pd), aluminium (Al), or molybdenum (Mo), or an alloy such as, for example, Al:Nd or Mo:W. However, the material of the gate electrode 103 is not limited thereto, and the gate electrode 103 may be formed of any of various materials having sufficient adhesion (e.g., to an adjacent layer), flatness, electrical resistance, and processability characteristics.

A gate insulating film 104 may be formed to cover the gate electrode 103 and the scan lines S.

An active layer 105 may be formed on the gate insulating film 104, as shown in FIG. 5. The active layer 105 and the gate electrode 103 are insulated from each other by the gate insulating film 104. The active layer 105 may include an inorganic semiconductor material such as, for example, silicon. Alternatively, the active layer 105 may be formed of an organic semiconductor or an oxide semiconductor material. However, the active layer 105 is not limited thereto.

A source electrode 107 and a drain electrode 108 are formed on the active layer 105. Any one of the source electrode 106 and the drain electrode 108 is connected to the data lines D. In the present exemplary embodiment, the source electrode 107 is connected to the data lines D. The data lines D are formed on the gate insulating film 104, as shown in FIG. 6.

An ohmic contact layer may be further formed between the active layer 105 and the source and drain electrodes 107 and 108. In addition, an etch stopper may be formed on a portion of a top surface of the active layer 105 that is not covered by the source electrode 107 and the drain electrode 108.

A first insulating layer 109 may be formed on the source electrode 107, the drain electrode 108, and the data lines D, as shown in FIG. 5. The first insulating layer 109 may be formed to include any of various insulating materials.

A planarization layer 139 may be formed on the first insulating layer 109, as shown in FIGS. 5 and 6. The planarization layer 139 may have a predetermined thickness to planarize an uneven top surface due to members disposed under the planarization layer 139. The planarization layer 139 may include, for example, an organic material.

The pixel electrode 140 may be formed on the planarization layer 139, as shown in FIGS. 5 and 6. The pixel electrode 140 may be formed of a transmissive conductive material such as, for example, zinc oxide, indium tin oxide, tin oxide, indium oxide, gallium oxide, indium zinc oxide, or aluminium zinc oxide, however the pixel electrode 140 is not limited thereto.

The pixel electrode 140 is connected to the drain electrode 108 through a via-hole VH, as shown in FIGS. 3 through 5. The via-hole VH may be formed by removing predetermined portions of the insulating film(s) (e.g., the first insulating layer 109 and the planarization layer 139) disposed between the drain electrode 108 and the pixel electrode 140 to expose a predetermined portion of the drain electrode 108. The pixel electrode 140 is formed to contact the portion of the drain electrode 108 exposed through the via-hole VH. The pixel electrode may also be formed to contact a portion of the source electrode 107 exposed through the via-hole VH.

A second insulating layer 141 may be formed on the pixel electrode 140, as shown in FIGS. 5 and 6. The second insulating layer 141 may be formed of any of various materials such as, for example, oxide or nitride.

The first touch electrodes 110-1 through 110-4 and the common electrodes 150-1 and 150-2 may be formed on the second insulating layer 141. The first touch electrodes 110-1 through 110-4 are formed of a metal material. The first touch electrodes 110-1 through 110-4 may be formed of an opaque material, which may reduce resistance of the first touch electrodes 110-1 through 110-4 and may prevent external light from being reflected (or reduce the amount of external light reflected). The main body portion 111 may be formed to overlap with the scan lines S, and the branching portions 112 may be formed to overlap with the data lines D, such that an area of a region where an image is formed is not reduced. As a result, image quality characteristics of the liquid crystal display device 100 may be improved.

Since the branching portions 112 are formed to overlap with the data lines D, even when a black matrix is not formed between a color filter CF1 and a color filter CF2 that are disposed at both sides of each of the data lines D, as shown in FIG. 6, color mixture between the color filter CF 1 and the color filter CF2 may be prevented or reduced, and an aperture ratio may be increased.

The common electrodes 150-1 and 150-2 may be formed on the second insulating layer 141, as shown in FIGS. 5 and 6. The common electrodes 150-1 and 150-2 may be formed of a transmissive conductive material, and may be formed of any of various materials used to form the pixel electrode 140, however the common electrodes 150-1 and 150-2 are not limited thereto.

Each of the common electrodes 150-1 and 150-2 may include a plurality of slits 150a, each corresponding to the pixel electrode 140. An image is formed by controlling an arrangement of liquid crystal molecules in the liquid crystal layer 160 via an electric field formed between the pixel electrode 140 and the common electrodes 150-1 and 150-2. In this case, the plurality of slits 150a are formed to improve characteristics of the electric field formed between the pixel electrode 140 and the common electrodes 150-1 and 150-2. The structure of the slits 150a shown in FIG. 3 are exemplary, and the slits 150a are not limited thereto. For example, the slits 150a may have any of various shapes and sizes, and the number and positioning of the slits 150a may vary.

The common electrodes 150-1 and 150-2 may be formed on the first touch electrodes 110-1 and 110-2, as shown in FIGS. 3 through 5. The common electrode 150-1 and the common electrode 150-2 are separately formed to be spaced apart from each other. The common electrode 150-1 may be formed on the first touch electrode 110-1 to contact the first touch electrode 110-1. The common electrode 150-1 may extend in the same direction, or substantially the same direction as a direction in which the main body portion 111 of the first touch electrode 110-1 extends (e.g., in the X-axis direction of FIGS. 3 and 4).

The common electrode 150-2 is spaced apart from the common electrode 150-1, and may be formed on the first touch electrode 110-2 and contact the first touch electrode 110-2. As shown in FIGS. 3 and 4, the common electrode 150-2 may longitudinally extend in the X-axis direction.

Since the common electrodes 150-1 and 150-2 are formed on the first touch electrodes 110-1 and 110-2 and contact the first touch electrodes 110-1 and 110-2, electrical resistance of the common electrodes 150-1 and 150-2 and the first touch electrodes 110-1 and 110-2 may be reduced, and an electrical short-circuit due to the connection between the first touch electrode 110-1 and the first touch electrode 110-2 may be prevented.

The second substrate 191 faces the first substrate 101, and the liquid crystal layer 160 is disposed between the first substrate 101 and the second substrate 191. For example, the liquid crystal layer 160 may be formed on the common electrodes 150-1 and 150-2, as shown in FIGS. 5 and 6.

A color filter CF may be disposed between the second substrate 191 and the liquid crystal layer 160, as shown in FIG. 5. An overcoat layer 180 may be formed on the color filter CF.

A black matrix BM may be disposed such that it contacts the color filter CF, as shown in FIG. 5. For example, the black matrix BM may be formed to be adjacent to a plurality of color filters CF having different colors, and such that it covers other lines such as, for example, the scan lines S and the data lines D.

In this case, since the branching portions 112 are formed to overlap with the data lines D, as shown in FIG. 6, even when no black matrix is formed between the color filter CF1 and the color filter CF2, which are disposed at both sides of each of the data lines D, color mixture between the color filter CF1 and the color filter CF2 may be prevented or reduced. Further, when the color filter CF1 and the color filter CF2 are formed such that side surfaces of the color filter CF1 and the color filter CF2 contact each other, an aperture ratio of the liquid crystal display device 100 may be increased.

The second touch electrodes 120 may be formed on a top surface of the second substrate 191, as shown in FIG. 5. The second touch electrodes 120 are each formed to cross the main body portion 111 of the first touch electrode 110.

A backlight unit that emits light may be disposed adjacent to the first substrate 101.

In addition, a first polarization layer may be formed to be adjacent to the first substrate 101, and a second polarization layer may be further disposed adjacent to the second substrate 191.

According to exemplary embodiments of the present invention, in addition to performing an image-forming function, the liquid crystal display device 100 may perform a touch recognition function without utilizing a separate touch panel by using the first touch electrodes 110-1 through 110-4 and the second touch electrodes 120. That is, according to exemplary embodiments, the liquid crystal display device 100 includes a single display panel capable of performing both image-forming functionality and touch recognition functionality.

As described above, in exemplary embodiments, the first touch electrodes 110-1 through 110-4 each include a main body portion 111 that extends in one direction and a plurality of branching portions 112 that are connected to the main body portion 111 and extend in a different direction, which may reduce electrical resistance of the first touch electrodes 110-1 through 110-4, and may improve a touch function through the first touch electrodes 110-1 through 110-4 and the second touch electrodes 120.

Further, in exemplary embodiments, the first touch electrodes 110-1 through 110-4 including the branching portions 112 are formed of an opaque metal, which may result in maintaining image quality characteristics, including an aperture ratio, of the liquid crystal display device 100, and reducing electrical resistance of the first touch electrodes 110-1 through 110-4.

Further, in exemplary embodiments, even when the color filters CF are adjacent to one another using the branching portions 112 and have different colors, color mixture may be prevented or reduced without utilizing a black matrix.

Figure 7:
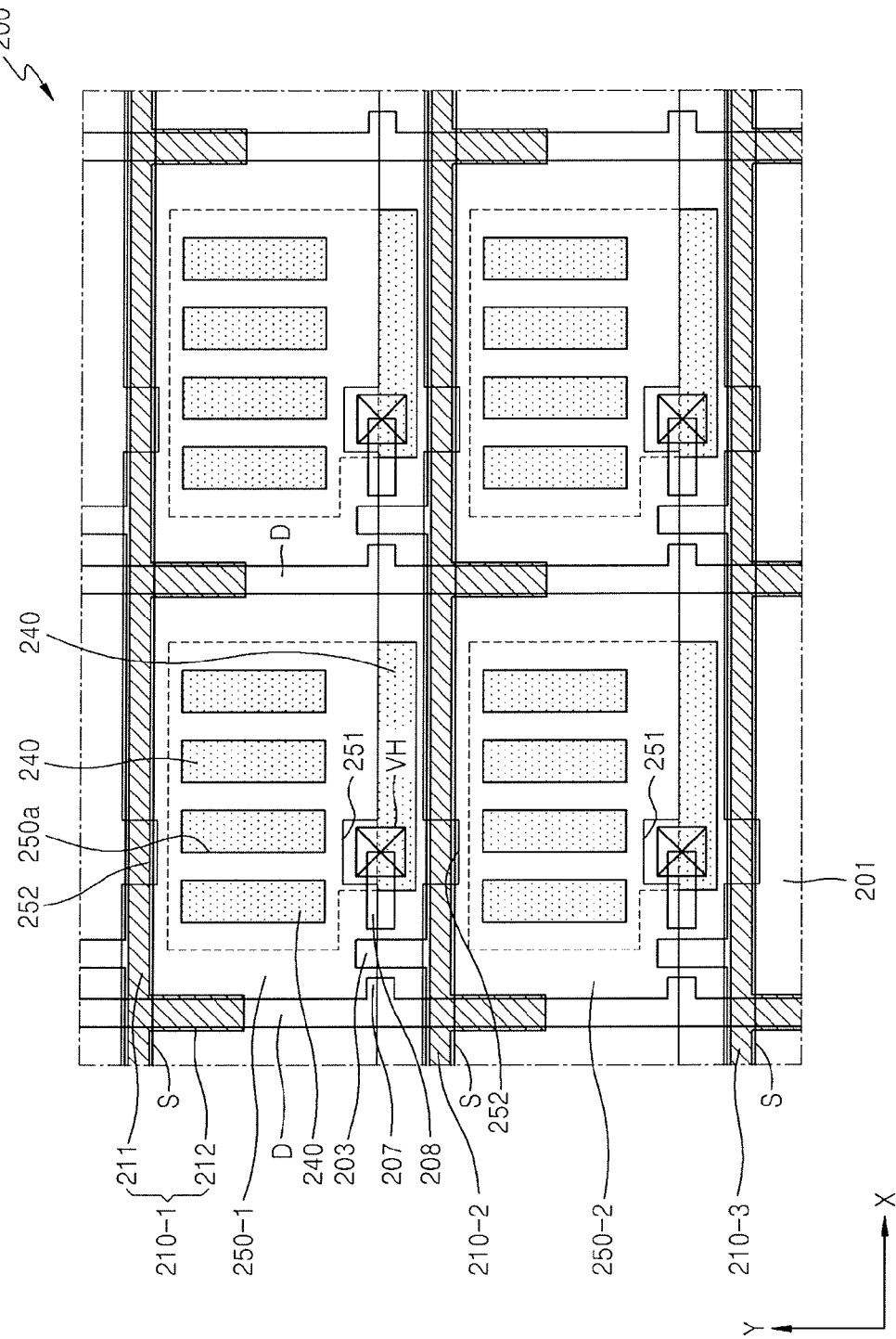
FIG. 7 is a plan view illustrating a liquid crystal display device, according to an exemplary embodiment of the present invention.

FIG. 7 is a plan view illustrating a liquid crystal display device 200, according to an exemplary embodiment of the present invention. For convenience of explanation, a description of elements previously described may be omitted.

Referring to FIG. 7, the liquid crystal display device 200 may include a first substrate 201, a liquid crystal layer, a pixel electrode 240, common electrodes 250-1 and 250-2, first touch electrodes 210-1 through 210-3, and second touch electrodes.

In the liquid crystal display device 200, one or more pixels that form an image are formed on a display area. The plurality of scan lines S and the plurality of data lines D are connected to each of the pixels.

The first touch electrodes 210-1 through 210-3 and the second touch electrodes enable the liquid crystal display device 200 to perform a touch recognition function in addition to an image-forming function. Structures of the second touch electrodes may be the same or substantially the same as those described above, and thus, a detailed explanation thereof is omitted.

Each of the first touch electrodes 210-1 through 210-3 includes a main body portion 211 and a plurality of branching portions 212. The plurality of branching portions 212 are disposed at predetermined intervals to be spaced apart from each other.

The respective structures of the first touch electrodes 210-1 through 210-3 are the same or substantially the same as those described above, and thus a detailed explanation thereof is omitted.

Further, the respective structures of a gate electrode 203, a gate insulating film, an active layer, a source electrode 207, a drain electrode 208, a first insulating layer, a planarization layer, a pixel electrode 240, and a via-hole VH are the same or substantially the same as those described above, and thus, a detailed explanation thereof is omitted.

The common electrodes 250-1 and 250-2 may be formed on a second insulating layer. The common electrodes 250-1 and 250-2 may be formed of a transmissive conductive material. Each of the common electrodes 250-1 and 250-2 includes a plurality of slits 250a, each corresponding to the pixel electrode 240.

The common electrodes 250-1 and 250-2 are formed on the first touch electrodes 210-1 and 210-2. The common electrodes 250-1 and 250-2 are separately formed to be spaced apart from each other. The common electrode 250-1 is formed on the first touch electrode 210-1 and contacts the first touch electrode 210-1. The common electrode 250-2 is spaced apart from the first touch electrode 210-1, and is formed on the first touch electrode 210-2 and contacts the first touch electrode 210-2.

Each of the common electrodes 250-1 and 250-2 may include concave portions 251 and 252. The concave portions 251 and 252 are formed to correspond to the via-hole VH. Accordingly, the common electrodes 250-1 and 250-2 do not overlap with the via-hole VH.

The concave portion 251 may be formed on a side (e.g., a lower side) of the common electrodes 250-1 and 250-2, and the concave portion 252 may be formed on the opposing side (e.g., an upper side) of the common electrodes 250-1 and 250-2, as shown in FIG. 7.

Since the adjacent common electrodes 250-1 and 250-2 include the concave portions 251 and 252 in the exemplary embodiment shown in FIG. 7, the common electrode 250-1 and the common electrode 250-2 do not overlap with the via-hole VH. For example, as a result of the formation of the concave portions 251 and 252, a distance between the common electrode 250-1 and the common electrode 250-2 is increased. As a result, an electrical connection between the common electrode 250-1 and the common electrode 250-2 around the via-hole VH may be prevented, which in turn may prevent a short-circuit from occurring between the first touch electrode 210-1 and the first touch electrode 210-2, which may prevent a touch function of the liquid crystal display device 200 from being reduced.

In an exemplary embodiment, when the concave portion 251 is formed in the common electrode 250-1, the concave portion 252 may not be formed in the common electrode 250-2. Alternatively, when the concave portion 252 is formed in the common electrode 250-2, the concave portion 251 may not be formed in the common electrode 250-1.

The respective structures of a second substrate, a color filter, an overcoat layer, and a black matrix may be the same or substantially the same as those described above, and thus, a detailed explanation thereof is omitted. A backlight unit that emits light, a first polarization layer, and a second polarization layer may be further included in the liquid crystal display device 200.

Figure 8:
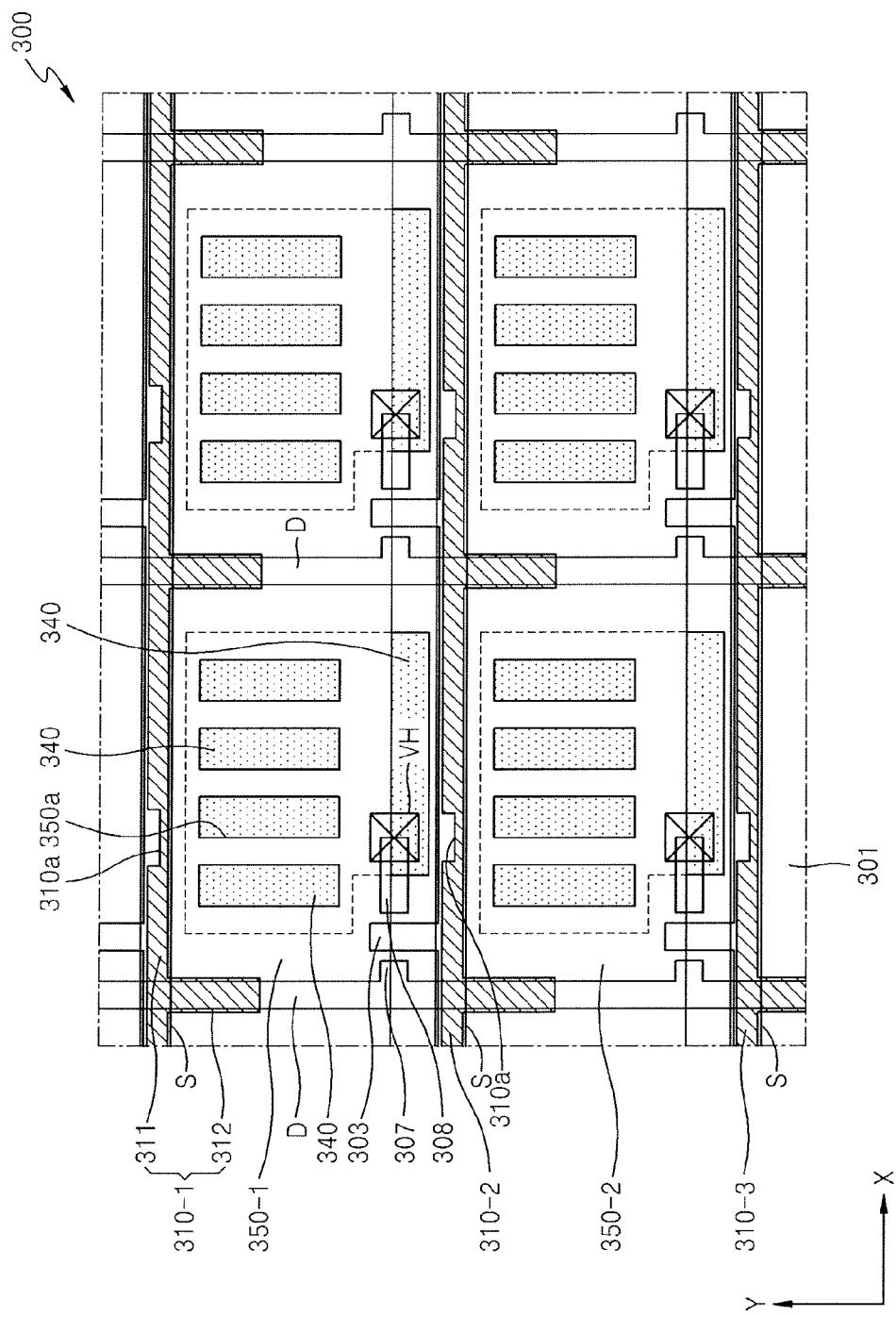
FIG. 8 is a plan view illustrating a liquid crystal display device, according to an exemplary embodiment of the present invention.

FIG. 8 is a plan view illustrating a liquid crystal display device 300, according to an exemplary embodiment of the present invention.

Referring to FIG. 8, the liquid crystal display device 300 may include a first substrate 301, a liquid crystal layer, a pixel electrode 340, common electrodes 350-1 and 350-2, first touch electrodes 310-1 through 310-3, and second touch electrodes.

In the liquid crystal display device 300, one or more pixels that form an image are formed on a display area. The plurality of scan lines S and the plurality of data lines D are connected to each of the pixels.

The first touch electrodes 310-1 through 310-3 and the second touch electrodes enable the liquid crystal display device 300 to perform a touch recognition function in addition to an image-forming function. Structures of the second touch electrodes may be the same or substantially the same as those described above, and thus, a detailed explanation thereof is omitted.

Each of the first touch electrodes 310-1 through 310-3 includes a main body portion 311 and a plurality of branching portions 312. The plurality of branching portions 312 are disposed at predetermined intervals to be spaced apart from each other.

The main body portion 311 may include a concave portion 310a. The concave portion 310a is formed such that it faces the via-hole VH, and corresponds to the via-hole VH. In this case, the concave portion 310a may have a width corresponding to a width of the corresponding via-hole VH. In an exemplary embodiment, the concave portion 310a may have a width greater than a width of the corresponding via-hole VH.

Since the concave portion 310a is formed in the main body portion 311 of the first touch electrode 310-2 that is disposed adjacent to the common electrode 350-1, and more particularly, since the concave portion 310a is formed in the main body portion 311 to face the via-hole VH and correspond to the via-hole VH, an electrical connection between the common electrode 350-1 and the first touch electrode 310-2 may be prevented. As a result, a short-circuit between the first touch electrode 310-2 and the first touch electrode 310-1 contacting the common electrode 350-1 may be prevented from occurring, which may prevent a touch function of the liquid crystal display device 300 from being reduced.

The respective structures of a gate electrode 303, a gate insulating film, an active layer, a source electrode 307, a drain electrode 308, a first insulating layer, a planarization layer, a pixel electrode 340, and the via-hole VH may be the same or substantially the same as those described above, and thus, a detailed explanation thereof is omitted.

The common electrodes 350-1 and 350-2 may be formed on a second insulating layer. The common electrodes 350-1 and 350-2 may be formed of a transmissive conductive material. Each of the common electrodes 350-1 and 350-2 includes a plurality of slits 350a, each corresponding to the pixel electrode 340.

The common electrodes 350-1 and 350-2 may be formed on the first touch electrodes 310-1 and 310-2. The common electrode 350-1 and the common electrode 350-2 are separately formed to be spaced apart from each other. The common electrode 350-1 is formed on the first touch electrode 310-1 and contacts the first touch electrode 310-1. The common electrode 350-2 is spaced apart from the common electrode 350-1, and is formed on the first touch electrode 310-2 and contacts the first touch electrode 310-2.

The respective structures of a second substrate, a color filter, an overcoat layer, and a black matrix may be the same or substantially the same as described above, and thus, a detailed explanation thereof is omitted.

A backlight unit that emits light, a first polarization layer, and a second polarization layer may be further included in the liquid crystal display device 300.

Figure 9:
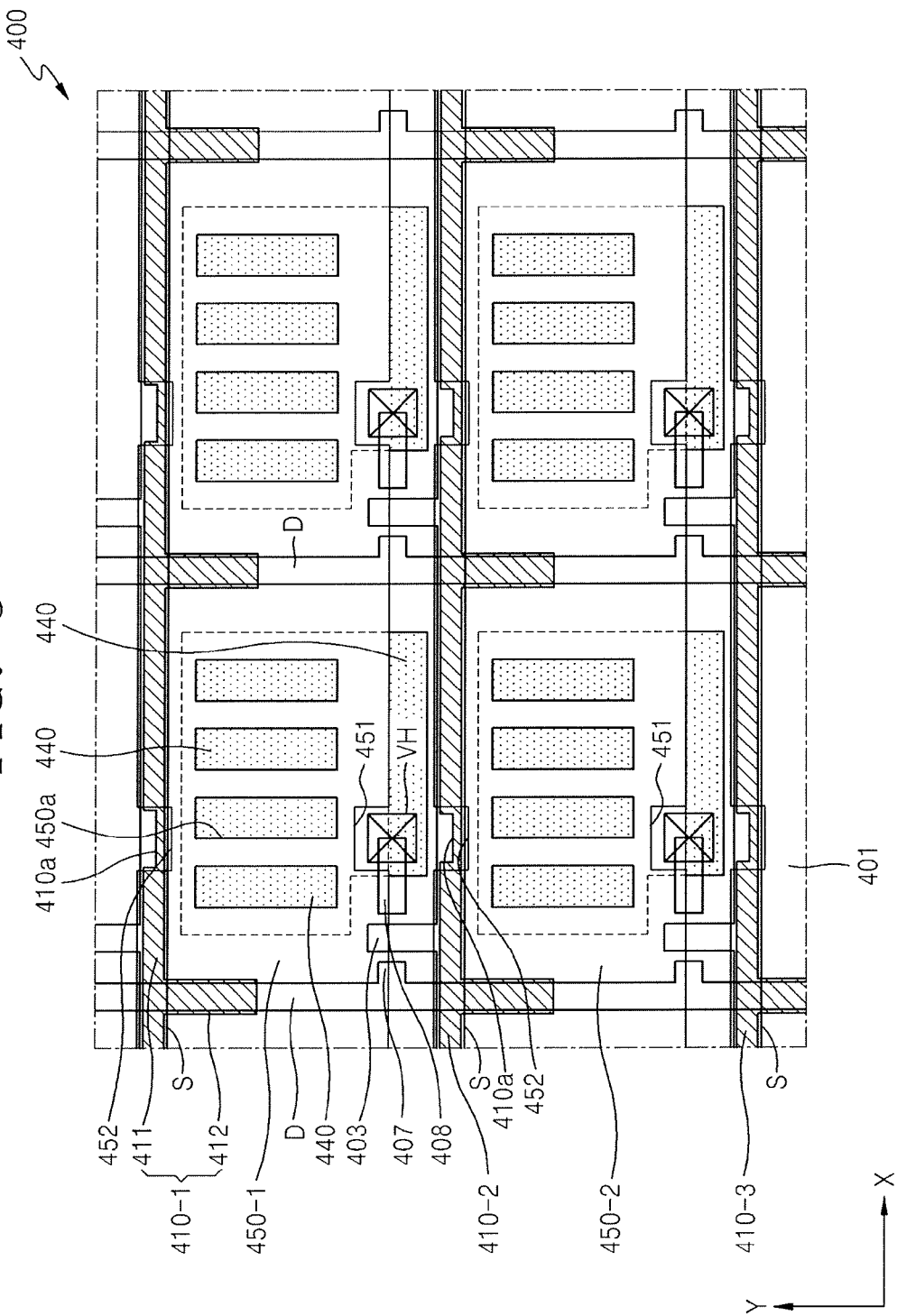
FIG. 9 is a plan view illustrating a liquid crystal display device, according to an exemplary embodiment of the present invention.

FIG. 9 is a plan view illustrating a liquid crystal display device 400, according to an exemplary embodiment of the present invention. For convenience of explanation, a description of elements previously described may be omitted.

Referring to FIG. 9, the liquid crystal display device 400 may include a first substrate 401, a liquid crystal layer, a pixel electrode 440, common electrodes 450-1 and 450-2, first touch electrodes 410-1 through 410-3, and second touch electrodes.

In the liquid crystal display device 400, one or more pixels that form an image are formed on a display area. The plurality of scan lines S and the plurality of data lines D are connected to each of the pixels.

The first touch electrodes 410-1 through 410-3 and the second touch electrodes enable the liquid crystal display device 400 to perform a touch recognition function in addition to an image-forming function. Structures of the second touch electrodes may be the same or substantially the same as those described above, and thus, a detailed explanation thereof is omitted.

Each of the first touch electrodes 410-1 through 410-3 includes a main body portion 411 and a plurality of branching portions 412. The plurality of branching portions 412 are disposed at predetermined intervals to be spaced apart from each other.

The main body portion 411 includes a concave portion 410a. The concave portion 410a is formed to face the via-hole VH, and corresponds to the via-hole VH. In this case, the concave portion 410a may have a width corresponding to a width of the via-hole VH. In an exemplary embodiment, the concave portion 410a may have a width greater than a width of the corresponding via-hole VH.

As a result of the formation of the concave portion 410a of the first touch electrode 410-2, an electrical connection between the common electrode 450-1 and the first touch electrode 410-2 may be prevented. As a result, a short-circuit between the first touch electrode 410-1 and the first touch electrode 410-2 may be prevented.

The respective structures of a gate electrode 403, a gate insulating film, an active layer, a source electrode 407, a drain electrode 408, a first insulating layer, a planarization layer, a pixel electrode 440, and the via-hole VH may be the same or substantially the same as those described above, and thus, a detailed explanation thereof is omitted.

The common electrodes 450-1 and 450-2 may be formed on a second insulating layer. The common electrodes 450-1 and 450-2 may be formed of a transmissive conductive material. Each of the common electrodes 450-1 and 450-2 includes a plurality of slits 450a, each corresponding to the pixel electrode 440.

The common electrodes 450-1 and 450-2 are formed on the first touch electrodes 410-1 and 410-2. The common electrode 450-1 and the common electrode 450-2 are separately formed to be spaced apart from each other. The common electrode 450-1 is formed on the first touch electrode 410-1 and contacts the first touch electrode 410-1. The common electrode 450-2 is spaced apart from the common electrode 450-1, and is formed on the first touch electrode 410-2 and contacts the first touch electrode 410-2.

Each of the common electrodes 450-1 and 450-2 may include concave portions 451 and 452. The concave portions 451 and 452 are formed to correspond to the via-hole VH. Accordingly, the common electrodes 450-1 and 450-2 do not overlap with the via-hole VH.

In FIG. 9, the concave portion 451 is formed on a lower side of the common electrodes 450-1 and 450-2, and the concave portion 452 is formed on an upper side of the common electrodes 450-1 and 450-2.

As described above, the adjacent common electrodes 450-1 and 450-2 include the concave portions 451 and 452. Accordingly, the common electrode 450-1 and 450-2 do not overlap with at least the via-hole VH. For example, as a result of the formation of the concave portions 451 and 452, a distance between the common electrode 450-1 and the common electrode 450-2 is increased. As a result, an electrical connection between the common electrode 450-1 and the common electrode 450-2 around the via-hole VH may be prevented, which in turn may prevent a short-circuit from occurring between the first touch electrode 410-1 and the second touch electrode 410-2, which may prevent a touch function of the liquid crystal display device 400 from being reduced.

In an exemplary embodiment, when the concave portion 451 is formed in the common electrode 450-1, the concave portion 452 may not be formed in the common electrode 450-2. Alternatively, when the concave portion 452 is formed in the common electrode 450-2, the concave portion 451 may not be formed in the common electrode 450-1.

The respective structures of a second substrate, a color filter, an overcoat layer, and a black matrix may be the same or substantially the same as those described above, and thus, a detailed explanation thereof is omitted.

A backlight unit that emits light, a first polarization layer, and a second polarization unit may be further included in the liquid crystal display device 400.

Figure 10:
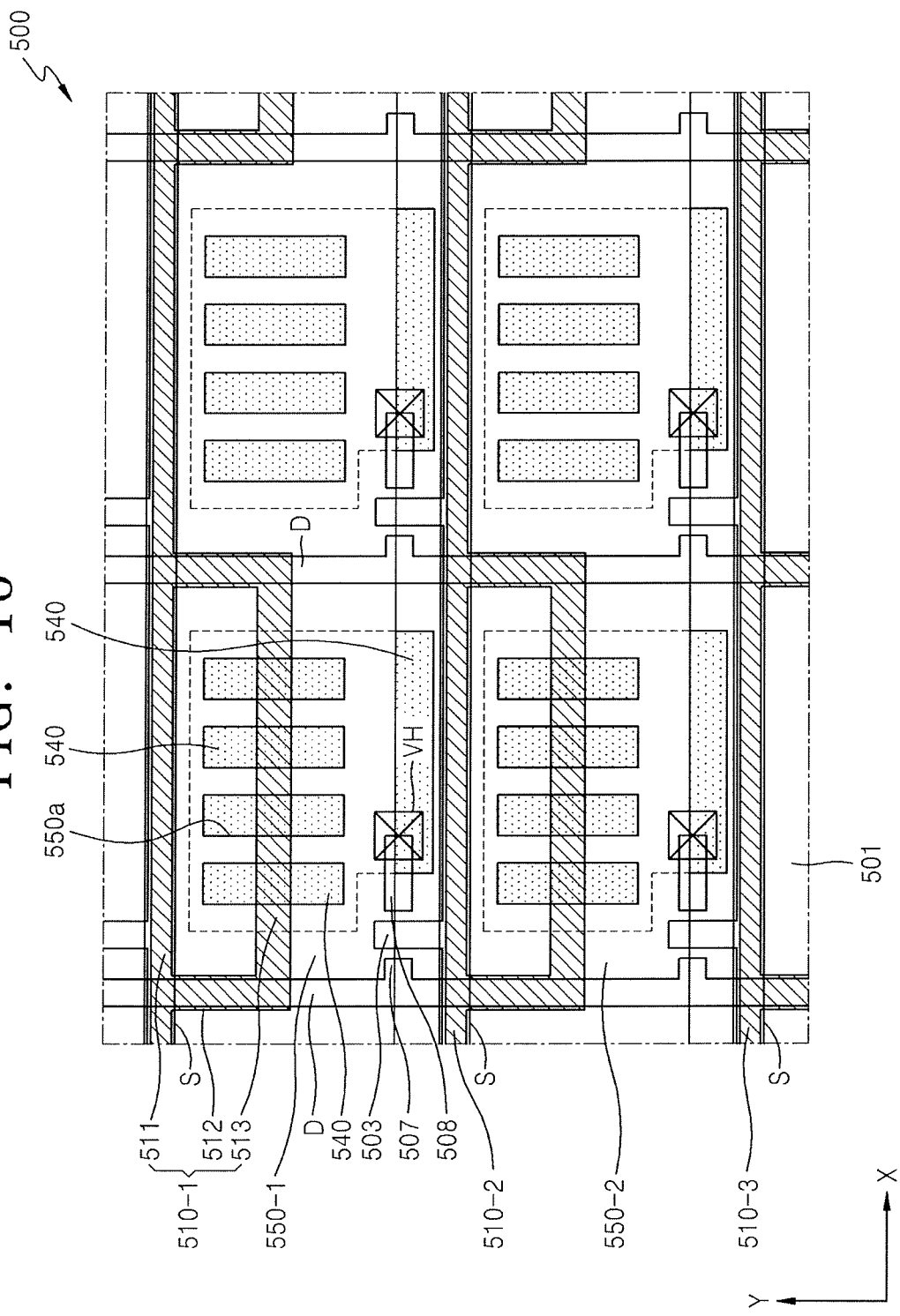
FIG. 10 is a plan view illustrating a liquid crystal display device, according to an exemplary embodiment of the present invention.

FIG. 10 is a plan view illustrating a liquid crystal display device 500, according to an exemplary embodiment of the present invention. For convenience of explanation, a description of elements previously described may be omitted.

Referring to FIG. 10, the liquid crystal display device 500 may include a first substrate 501, a liquid crystal layer, a pixel electrode, common electrodes 550-1 and 550-2, first touch electrodes 510-1 through 510-3, and second touch electrodes.

In the liquid crystal display device 500, one or more pixels that form an image are formed on a display area. The plurality of scan lines S and the plurality of data lines D are connected to each of the pixels.

The first touch electrodes 510-1 through 510-3 and the second touch electrodes enable the liquid crystal display device 500 to perform a touch recognition function in addition to an image-forming function. Structures of the second touch electrodes may be the same or substantially the same as those described above, and thus, a detailed explanation thereof is omitted.

Each of the first touch electrodes 510-1 through 510-3 includes a main body portion 511, a plurality of branching portions 512, and a connecting portion 513.

The main body portion 511 extends in one direction (e.g., in the X-axis direction) in FIG. 10. The plurality of branching portions 512 are connected to the main body portion 511, and are disposed at predetermined intervals to be spaced apart from each other.

The connecting portion 513 is formed to connect two adjacent branching portions from among the plurality of branching portions 512.

The respective structures of a gate electrode 503, a gate insulating film, an active layer, a source electrode 507, a drain electrode 508, a first insulating layer, a planarization layer, a pixel electrode 540, and a via-hole VH may be the same as or substantially the same as those described above, and thus, a detailed explanation thereof is omitted.

The common electrodes 550-1 and 550-2 may be formed on a second insulating layer. The common electrodes 550-1 and 550-2 may be formed of a transmissive conductive material. Each of the common electrodes 550-1 and 550-2 includes a plurality of slits 550a, each corresponding to the pixel electrode 540.

The common electrodes 550-1 and 550-2 are formed on the first touch electrodes 510-1 and 510-2. The common electrode 550-1 and the common electrode 550-2 are separately formed to be spaced apart from each other. The common electrode 550-1 is formed on the first touch electrode 510-1 and contacts the first touch electrode 510-1. The common electrode 550-2 is spaced apart from the common electrode 550-1, and is formed on the first touch electrode 510-2 and contacts the first touch electrode 510-2.

The respective structures of a second substrate, a color filter, an overcoat layer, and a black matrix may be the same or substantially the same as those described above, and thus, a detailed explanation thereof is omitted.

A backlight unit that emits light, a first polarization layer, and a second polarization layer may be further included in the liquid crystal display device 500.

Each of the first touch electrodes 510-1 through 510-3 of the liquid crystal display device 500 include the main body portion 511 that extends in one direction, and the plurality of branching portions 512 that are connected to the main body portion 511 and extend in a different direction. As a result, an improper electrical connection of the first touch electrode 510-1 may be prevented, which may improve a touch function through the first touch electrodes 510-1 and 510-2 and the second touch electrodes.

The connecting portion 513 is formed such that it connects two adjacent branching portions from among the plurality of branching portions 512, which may reduce an electrical resistance of the first touch electrodes 510-1 and 510-2. Further, the connecting portion 513 supports the branching portions 512, which may prevent the branching portions 512 from being damaged.

As described above, a liquid crystal display device and a method of manufacturing the same according to exemplary embodiments of the present invention may be utilized to perform a touch function as well as an image display function.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A liquid crystal display device, comprising:
a first substrate;
a second substrate facing the first substrate;
a liquid crystal layer disposed between the first substrate and the second substrate;
a pixel electrode;
a common electrode facing the pixel electrode;
a plurality of scan lines extending in a first direction;
a plurality of data lines;
a plurality of first touch electrodes, wherein each first touch electrode comprises a main body portion extending in the first direction and overlapping one of the plurality of scan lines, and a plurality of branching portions extending from the main body portion in a second direction, different from the first direction; and
a plurality of second touch electrodes crossing the main body portion of each first touch electrode from among the plurality of first touch electrodes,
wherein each of the plurality of second touch electrodes is disposed between adjacent data lines of the plurality of data lines, and
wherein the plurality of branching portions of each first touch electrode overlap at least one data line from among the plurality of data lines.

2. The liquid crystal display device of claim 1, wherein the plurality of branching portions of each first touch electrode are spaced apart from each other.

3. The liquid crystal display device of claim 1, wherein the plurality of branching portions of one first touch electrode from among the plurality of first touch electrodes are spaced apart from the main body portion of an adjacent first touch electrode.

4. The liquid crystal display device of claim 1, wherein the common electrode is formed on the plurality of first touch electrodes.

5. The liquid crystal display device of claim 1, wherein the common electrode contacts the plurality of first touch electrodes.

6. The liquid crystal display device of claim 1, further comprising:
a plurality of common electrodes,
wherein the common electrode is one of the plurality of common electrodes, and the plurality of common electrodes longitudinally extend and correspond to the plurality of first touch electrodes.

7. The liquid crystal display device of claim 1, further comprising:
a plurality of common electrodes,
wherein the common electrode is one of the plurality of common electrodes, and the plurality of common electrodes are spaced apart from each other.

8. The liquid crystal display device of claim 1, further comprising:
an active layer;
a gate electrode;
a source electrode disposed between the first substrate and the pixel electrode;
a drain electrode disposed between the first substrate and the pixel electrode; and
at least one insulating layer disposed between the pixel electrode and the source and drain electrodes,
wherein the pixel electrode is connected to the source electrode or the drain electrode through a via-hole formed in the at least one insulating layer.

9. The liquid crystal display device of claim 8, further comprising:
a plurality of common electrodes, wherein the common electrode is one of the plurality of common electrodes; and
a plurality of via-holes, wherein the via-hole is one of the plurality of via-holes,
wherein the plurality of common electrodes correspond to the plurality of first touch electrodes, and each common electrode from among the plurality of common electrodes comprises a concave portion corresponding to a via-hole from among the plurality of via-holes.

10. The liquid crystal display device of claim 9, wherein each common electrode from among the plurality of common electrodes does not overlap a corresponding via-hole.

11. The liquid crystal display device of claim 9, wherein each concave portion is formed in one side of a corresponding common electrode from among the plurality of common electrodes.

12. The liquid crystal display device of claim 8, further comprising:
a plurality of via-holes, wherein the via-hole is one of the plurality of via-holes,
wherein the main body portion of each first touch electrode from among the plurality of first touch electrodes comprises a concave portion corresponding to a via-hole from among the plurality of via-holes.

13. The liquid crystal display device of claim 12, wherein each concave portion faces the corresponding via-hole.

14. The liquid crystal display device of claim 12, wherein each concave portion has a width greater than a width of the corresponding via-hole.

15. The liquid crystal display device of claim 1, wherein each first touch electrode from among the plurality of first touch electrodes further comprises a connecting portion connecting two adjacent branching portions from among the plurality of branching portions of each of the plurality of first touch electrodes.

16. The liquid crystal display device of claim 1, further comprising:
a plurality of color filters disposed between the first substrate and the second substrate,
wherein side surfaces of color filters disposed at both sides of each of the plurality of branching portions from among the plurality of color filters contact each other.

17. The liquid crystal display device of claim 1, wherein the plurality of second touch electrodes are formed on the second substrate.

18. The liquid crystal display device of claim 1, wherein the plurality of first touch electrodes are formed of an opaque metal material.

19. A method of manufacturing a liquid crystal display device, comprising:
forming a first substrate;
forming a second substrate that faces the first substrate;
forming a liquid crystal layer between the first substrate and the second substrate;
forming a pixel electrode;
forming a common electrode that faces the pixel electrode;
forming a plurality of scan lines extending in a first direction;
forming a plurality of data lines;
forming a plurality of first touch electrodes disposed between the first substrate and the second substrate, wherein each first touch electrode comprises a main body portion extending in the first direction and overlapping one of the plurality of scan lines, and a plurality of branching portions extending from the main body portion in a second direction, different from the first direction; and
forming a plurality of second touch electrodes that cross the main body portion of each first touch electrode from among the plurality of first touch electrodes,
wherein each of the plurality of second touch electrodes is disposed between adjacent data lines of the plurality of data lines, and
wherein the plurality of branching portions of each first touch electrode overlap at least one data line from among the plurality of data lines.

20. A liquid crystal display device, comprising:
a first substrate;
a second substrate facing the first substrate;
a liquid crystal layer disposed between the first substrate and the second substrate;
a pixel electrode disposed on the first substrate;
a first touch electrode disposed on the first substrate, wherein the first touch electrode comprises a main body portion extending in a first direction and a plurality of branching portions extending from the main body portion in a second direction, substantially perpendicular to the first direction;
a common electrode disposed on and contacting the first touch electrode;
a second touch electrode disposed on the second substrate and crossing the main body portion of the first touch electrode;
a plurality of scan lines extending in the first direction, wherein the main body portion of the first touch electrode overlaps a scan line from among the plurality of scan lines; and
a plurality of data lines extending in the second direction, wherein each branching portion from among the plurality of branching portions overlaps a data line from among the plurality of data lines, wherein the second touch electrode is disposed between adjacent data lines of the plurality of data lines.

21. The liquid crystal display device of claim 20, wherein the common electrode comprises a concave portion formed in one side of the common electrode and corresponding to a via-hole, and the common electrode does not overlap the via-hole.

22. The liquid crystal display device of claim 20, wherein the main body portion of the first touch electrode comprises a concave portion corresponding to a via-hole and having a width greater than a width of the via-hole.

23. The liquid crystal display device of claim 20, wherein the first touch electrode further comprises a connecting portion connecting two adjacent branching portions from among the plurality of branching portions of the first touch electrode.

* * * * *